United States Patent
Takahashi et al.

(10) Patent No.: US 8,669,555 B2
(45) Date of Patent: Mar. 11, 2014

(54) SEMICONDUCTOR DEVICE

(71) Applicant: Panasonic Corporation, Osaka (JP)

(72) Inventors: Masao Takahashi, Osaka (JP); Koji Takemura, Osaka (JP); Toshihiko Sakashita, Osaka (JP); Tadaaki Mimura, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/684,369

(22) Filed: Nov. 23, 2012

(65) Prior Publication Data

US 2013/0075727 A1      Mar. 28, 2013

Related U.S. Application Data

(60) Division of application No. 13/179,331, filed on Jul. 8, 2011, now Pat. No. 8,338,829, which is a continuation of application No. 12/208,595, filed on Sep. 11, 2008, now Pat. No. 7,999,256.

(30) Foreign Application Priority Data

Sep. 25, 2007 (JP) .................. 2007-246576

(51) Int. Cl.
  *H01L 23/485*   (2006.01)
  *H01L 23/528*   (2006.01)
  *H01L 21/66*    (2006.01)

(52) U.S. Cl.
  USPC ............ 257/48; 257/758; 257/784; 257/786; 257/E23.02; 257/E23.151; 257/E21.521

(58) Field of Classification Search
  USPC ............... 257/48, 758, 784, 786, E23.02, 257/E23.151, E21.521
  See application file for complete search history.

(56) References Cited

U.S. PATENT DOCUMENTS

| | | | |
|---|---|---|---|
| 6,150,727 A | 11/2000 | Takagi | |
| 6,159,826 A * | 12/2000 | Kim et al. | 438/460 |
| 6,844,631 B2 * | 1/2005 | Yong et al. | 257/786 |
| 7,115,985 B2 * | 10/2006 | Antol et al. | 257/700 |
| 7,397,127 B2 * | 7/2008 | Lin et al. | 257/773 |
| 7,622,364 B2 * | 11/2009 | Adkisson et al. | 438/462 |
| 7,626,276 B2 * | 12/2009 | Hess et al. | 257/779 |
| 2005/0161835 A1 * | 7/2005 | Maeda | 257/786 |

(Continued)

FOREIGN PATENT DOCUMENTS

| | | |
|---|---|---|
| JP | 10-074790 A | 3/1998 |
| JP | 2002-016069 A | 1/2002 |
| JP | 2007-318014 A | 12/2007 |

OTHER PUBLICATIONS

United States Notice of Allowance issued in U.S. Appl. No. 12/208,595, mailed May 9, 2011.

(Continued)

*Primary Examiner* — Victor A Mandala
(74) *Attorney, Agent, or Firm* — McDermott Will & Emery LLP

(57) ABSTRACT

Electrode pads respectively have a probe region permitting probe contact and a non-probe region. In each of the electrode pads arranged zigzag in two or more rows, a lead interconnect for connecting another electrode pad with an internal circuit is not placed directly under the probe region but placed directly under the non-probe region.

19 Claims, 8 Drawing Sheets

(56) References Cited

U.S. PATENT DOCUMENTS

| | | |
|---|---|---|
| 2005/0173801 A1* | 8/2005 | Mimura et al. ............... 257/758 |
| 2005/0218916 A1 | 10/2005 | Hirai |
| 2006/0065969 A1* | 3/2006 | Antol et al. ................... 257/700 |
| 2006/0157856 A1* | 7/2006 | Ichikawa et al. .............. 257/758 |
| 2006/0170105 A1 | 8/2006 | Hirai |
| 2006/0186405 A1* | 8/2006 | Tanabe ........................... 257/48 |
| 2007/0085221 A1 | 4/2007 | Tanabe |
| 2007/0182001 A1 | 8/2007 | Kanzaki et al. |
| 2008/0303177 A1* | 12/2008 | Wu et al. ....................... 257/786 |
| 2010/0155960 A1 | 6/2010 | Kanzaki et al. |
| 2011/0175241 A1 | 7/2011 | Tanabe |

OTHER PUBLICATIONS

United States Notice of Allowance issued in U.S. Appl. No. 13/179,331, mailed Aug. 23, 2012.

* cited by examiner

A

| Region | Probe | External connection (Wire bond, bump, etc.) |
|---|---|---|
| Probe region | Permitted (Probe mark exists) | Permitted |
| Non-probe region | Prohibited (No probe mark) | Permitted |

|  | Average | Dispersion 3σ |
|---|---|---|
| Probe mark width | 12.8 μm(a) | 5.8 μm(b) |
| Probe mark end position | 0.0 μm(c) | 20.0 μm(d) |

※Number of evaluated samples N = 48 Pads
※The coordinates of the probe mark end position = 0 indicate the pad center line

SEMICONDUCTOR DEVICE

RELATED APPLICATIONS

This application is a Divisional of U.S. application Ser. No. 13/179,331, now U.S. Pat. No. 8,338,829, filed on Jul. 8, 2011, which is a Continuation of U.S. application Ser. No. 12/208,595, filed on Sep. 11, 2008, now U.S. Pat. No. 7,999,256, claiming priority of Japanese Patent Application No. 2007-246576, filed on Sep. 25, 2007, the entire contents of each of which are hereby incorporated by reference.

BACKGROUND OF THE INVENTION

1. Technical Field of the Invention

The present invention relates to electrode pads for external connection in a semiconductor integrated circuit device, and more particularly to the placement of zigzag-arranged electrode pads and lead interconnects running directly under the electrode pads, as well as the cross-sectional structure of the electrode pads.

2. Related Art

In recent years, with the progress of the digitalized society, higher-function, smaller-size and lower-cost semiconductor devices have been increasingly demanded. For lower-cost semiconductor devices, it is effective to increase the number of semiconductor chips taken from one wafer. Hence, along with the miniaturization of semiconductor devices, the chip area is increasingly reduced. With this reduction in chip area, together with increase in the number of pins resulting from the multifunction capability, it has become necessary to arrange electrode pads for external connection, placed in the peripheral portion of the semiconductor chip, at high density. The size of the electrode pads is already in a range any value below which is unavailable in consideration of the connectivity, pitch and reliability of wire bonds and bumps used for external connection and the pitch of probes used for testing. In view of this, there is implemented a semiconductor device in which electrode pads in the peripheral portion of a semiconductor chip are arranged zigzag, not in one row (see Japanese Laid-Open Patent Publication No. 10-74790, for example).

FIG. 9A is a plan view showing the structure of electrode pads of a first conventional semiconductor device, and FIG. 9B is an enlarged plan view of region D in FIG. 9A. FIG. 10A is an enlarged plan view showing the structure of electrode pads of a second conventional semiconductor device, and FIG. 10B is a cross-sectional view schematically illustrating occurrence of a crack in the second conventional semiconductor device.

As shown in FIGS. 9A and 9B, in the first conventional semiconductor device, the electrode pads are arranged zigzag in the peripheral portion of a semiconductor chip 111. Among the electrode pads, outer-row pads 121b are connected to an internal circuit 112 via respective lead interconnects 152. In the first conventional semiconductor device, however, it is necessary to arrange inner-row pads 121a apart from each other by the width of the lead interconnects 153, and this reduces the number of electrode pads allowed to be arranged per unit area.

To solve the above problem, as shown in FIG. 10A, lead interconnects 152 connected to outer-row pads 121b are made to run in a wiring layer lying directly under the inner-row pads 121a, so that the inner-row pads 121a and the lead interconnects 152 overlap each other as viewed from top. The number of electrode pads allowed to be arranged per unit area can therefore be increased.

SUMMARY OF THE INVENTION

In the second conventional semiconductor device, however, as shown in FIG. 10B, stress is exerted when a probe 113 is brought into contact with an electrode pad 121 in a probing process. As a result, a crack 117 may occur in an interlayer insulating film 141 formed between the pad 121 and a lead interconnect 152, causing a short-circuit fault, and this may raise a large problem in reliability.

In view of the above, an object of the present invention is providing a semiconductor device with improved reliability that can suppress the influence of a crack that may occur during probing without decreasing the number of electrode pads allowed to be arranged per unit area.

To solve the above problem, the semiconductor device of the present invention includes: an internal circuit; interconnects; and electrode pads arranged in a plurality of rows and electrically connected to the internal circuit via the interconnects, wherein each of the electrode pads has a probe region permitting probe contact and external connection and a non-probe region prohibiting probe contact but permitting external connection, and each of the interconnects is not formed directly under the probe region, but formed directly under the non-probe region.

With the above configuration, in which no interconnect is provided directly under the probe region, the portion of an interlayer insulating film under the probe region can be thickened, and thus occurrence of a crack due to stress of a probe can be suppressed. Also, with the interconnect being placed to overlap the non-probe region as viewed from top, it is unnecessary to reduce the number of electrode pads allowed to be arranged per unit area, which may otherwise be necessary with the existence of the interconnects. Dense pad arrangement is therefore possible.

In the semiconductor device of the invention, the probe region may be placed in a region within 20 µm from a center line of the electrode pad extending roughly in parallel with running of the interconnect, and the non-probe region may be placed in a region of the electrode pad other than the probe region. This placement is made because it has been found that considering variations in probe thickness and variations in the precision of the probe contact position, the region that may have contact of the probe during probing falls within 20 µm from the center line of the pad.

The semiconductor device of the invention may further include a pad metal formed directly under the probe region in a same wiring layer as the interconnect, the pad metal being connected to the electrode pad lying directly above the pad metal. With this configuration, it is possible to suppress occurrence of short-circuiting between the electrode pad and the interconnect due to a crack in the interlayer insulating film produced under probe stress. It is also possible to prevent the electrode pad from coming off due to upward stress vertical to the chip plane that may occur in a process of connection to an external circuit.

As described above, according to the semiconductor device of the present invention, a short-circuit fault between the electrode pad and the interconnect, which may occur from a crack in the interlayer insulating film produced under probe stress, can be prevented, and yet the interconnect can be placed under the non-probe region of the electrode pad. Hence, dense pad arrangement is possible without reducing the number of electrode pads permitted to be arranged per unit area, which may otherwise be unavailable with the existence of the interconnects. As a result, a semiconductor device that can attain cost reduction, resulting from reduction in chip size, enhancement in functions, resulting from increase in the number of pins, and improvement in reliability simultaneously can be provided.

DESCRIPTION OF THE PREFERRED EMBODIMENTS

Hereinafter, prior to description of embodiments of the present invention, definition of some terms used herein will be made with reference to FIGS. 1A and 1B and FIGS. 2A to 2D.

Figure 1A:
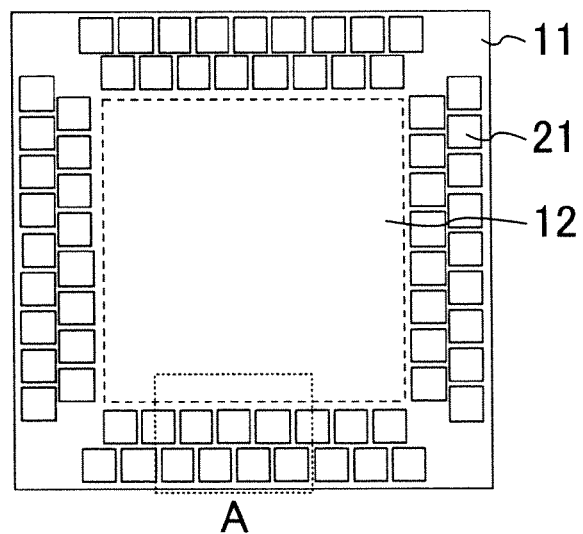
FIG. 1A is a plan view of a general semiconductor chip.
Figure 1B:
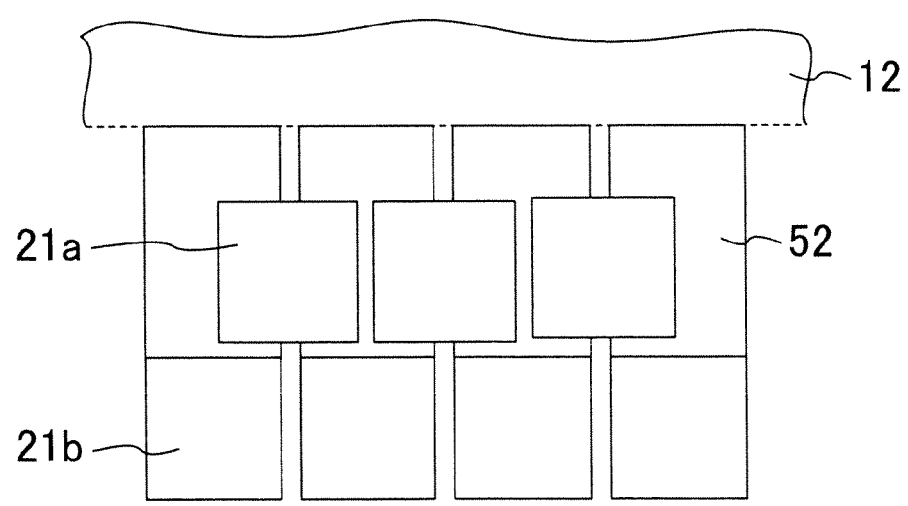
FIG. 1B is an enlarged plan view of region A in FIG. 1A.

FIG. 1A is a plan view of a general semiconductor chip, and FIG. 1B is an enlarged plan view of region A in FIG. 1A. A semiconductor chip 11 includes: an internal circuit 12 formed using a plurality of transistors; and electrode pads 21 arranged in the peripheral portion of the semiconductor chip 11 for electrical exchange with an external circuit and the like. The electrode pads 21 are arranged zigzag as shown in FIG. 1A because the necessity of arranging electrode pads at high density has recently arisen along with reduction in chip area and increase in the number of pins resulting from multifunction capability.

Herein, among the electrode pads, those arranged outermost are defined as "outer-row pads" (denoted by 21b) and those arranged internal to the outer-row pads are defined as "inner-row pads" (denoted by 21a). Although electrode pads in two-row zigzag arrangement are shown in FIGS. 1A and 1B, electrode pads in three or more row zigzag arrangement may also be adopted without changing the essence of the present invention. For example, in electrode pads in N-row zigzag arrangement, those in the outermost row are defined as the "outer-row pads", and those in the second to N-th rows defined as the "inner-row pads". The electrode pads 21, which are responsible for supply of power to the internal circuit from outside and input/output of an electric signal, normally must be electrically connected with the internal circuit 12. Interconnects responsible for connection between the electrode pads 21 and the internal circuit 12 are defined herein as "lead interconnects" (denoted by 52).

FIGS. 2A to 2D are views for demonstrating a "probe region" and a "non-probe region" as used herein.

Figure 2A:
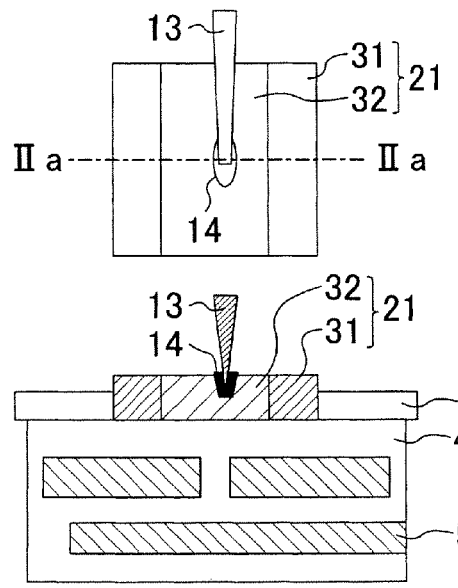
FIGS. 2A to 2D are plan/cross-sectional views showing a "probe region" and a "non-probe region" as defined herein.

FIG. 2A shows the probe contact state in a probing process in which a probe 13 is brought into contact with an electrode pad 21 for testing after an impurity diffusion process for a wafer. Having been in contact with the electrode pad 21, the probe 13 leaves a claw, i.e., a probe mark 14 on the surface of the electrode pad 21. As used herein, the region of the electrode pad 21 that may have contact of the probe 13 during testing is defined as the "probe region" (denoted by 32), and the region thereof that does not have contact (prohibits contact) of the probe 13 is defined as the "non-probe region" (denoted by 31). In other words, the "probe region" 32 can be defined as a region in which the probe mark 14 may exist, and the "non-probe region" 31 as a region in which the probe mark 14 does not exist. An interconnect 51 buried in an interlayer insulating film 41 runs under the electrode pad 21.

Figure 2B:
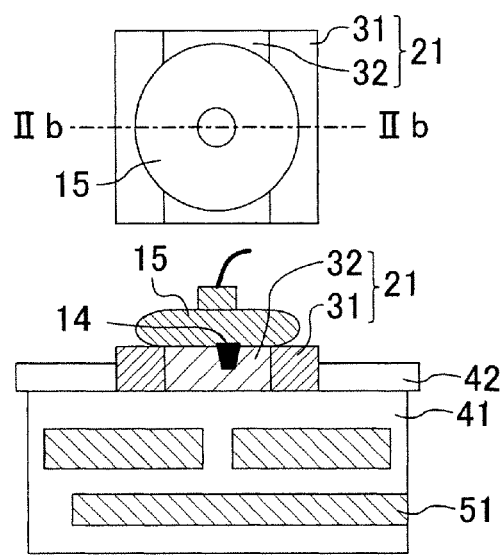

FIG. 2B shows a wire bonding process in which the electrode pad 21 is connected externally via a wire. In general, the contact area of a wire ball 15 is ten times as large as the probe mark 14. Herein, as shown in FIG. 2B, the wire bonding can be made to both the "probe region" 32 and the "non-probe region" 31. There is a connection technique other than that described in FIG. 2B, called wedge bonding, in which case also the definition is made in substantially the same manner.

Figure 2C:
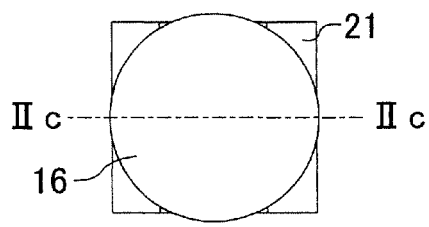
Figure 2D:
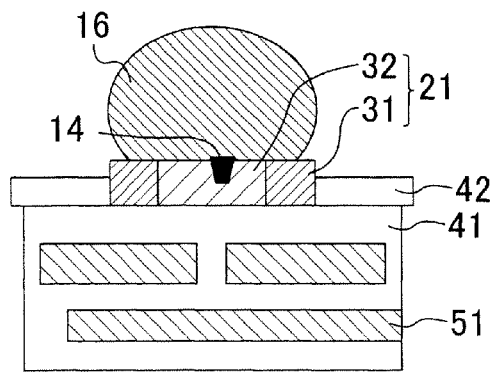

FIG. 2C shows a process of connecting the electrode pad 21 with an external circuit and the like via a bump 16. In this connection, the electrode pad 21 is made to face a package substrate via the bump 16. In this case, also, the bump can be bonded to both the "probe region" 32 and the "non-probe region" 31. Although various types and shapes of bumps produced in various techniques, such as Au bumps and solder bumps, are available, the definition is made in substantially the same manner for all bumps. The table of FIG. 2D summarizes the definition of the "probe region" and the "non-probe region". That is, the "probe region" is defined as a region allowing both probe contact and external connection, and the "non-probe region" is defined as a region prohibiting probe contact but allowing external connection Embodiment 1

Figure 3:
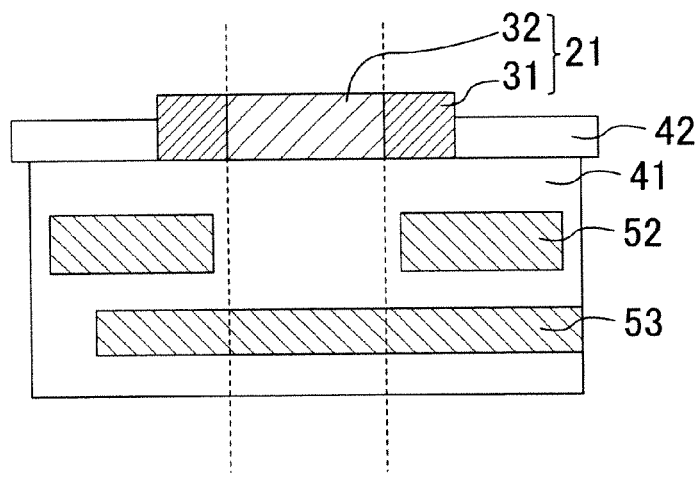
FIG. 3 is a cross-sectional view of a semiconductor device of Embodiment 1 of the present invention.

FIG. 3 is a cross-sectional view of a semiconductor device of Embodiment 1 of the present invention.

Referring to FIG. 3, the semiconductor device of this embodiment includes an internal circuit, lead interconnects 52, electrode pads 21 arranged zigzag in two or more rows around the internal circuit, and a protection film 42 surrounding the electrode pads 21. Each of the electrode pads 21 has the probe region 32 and the non-probe region 31 defined previously. The lead interconnects 52 run directly under the non-probe regions 31, but do not run directly under the probe regions 32. Each of the lead interconnects 52 is electrically independent of the electrode pad 21 located immediately above the lead interconnect. If they are short-circuited, the semiconductor device will fail to perform normal operation. According to the results of evaluations conducted by the present inventors, it has been found that due to stress exerted during a probing process, a crack occurs in an interlayer insulating film 41 existing between the electrode pad and its underlying interconnect in a direction vertical to the chip plane. To state differently, a crack occurs only in the region directly under the probe mark. It has also been found that in external connection of the electrode pad 21 via a wire bond, a bump or the like, in which the contact area on the electrode pad 21 is ten times as large as that during probing, no crack will occur in the interlayer insulating film 41 existing between the electrode pad 21 and its underlying interconnect due to stress of the wire bond or the bump. Moreover, it has been found that as the distance between the electrode pad and the interconnect is made larger to thicken the interlayer insulating film, the interlayer insulating film itself is more strengthened and as a result the frequency of occurrence of cracks decreases.

Hence, in the semiconductor device of Embodiment 1 of the present invention, since no lead interconnect exists directly under the probe region 32 and instead the interlayer insulating film 41 expands, the interlayer insulating film 41 is thickened in the direction vertical to the chip plane in which a crack tends to occur, compared with the conventional case. As a result, occurrence of a crack in the interlayer insulating film 41 due to probe stress can be prevented. The lead interconnect exists directly under the non-probe region 31, and stress will be exerted with a wire bond or a bump. In this case, however, a crack is not likely to occur in the interlayer insulating film 41 as discussed above. Also, since the lead interconnects 52 can be placed to overlap the non-probe regions 31 of the electrode pads 21 as viewed from top, the electrode pads 21 can be arranged densely without reducing the number of electrode pads allowed to be arranged per unit area. Note that a normal interconnect 53 can be placed under the probe region 32 without causing any trouble because the distance from the electrode pad 21 is large.

Figure 4:
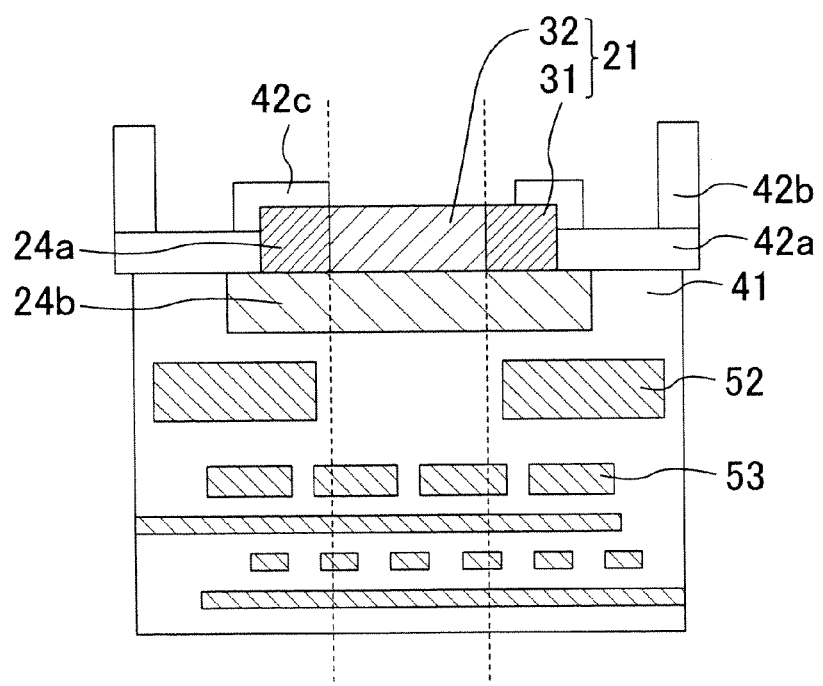
FIG. 4 is a cross-sectional view of another semiconductor device of Embodiment 1 of the present invention.

The present invention can be implemented without special regard to the materials of the components, the structure of the electrode pads 21, presence/absence of the protection film 42, the number of wiring layers and the thickness configuration. For example, FIG. 4 shows a cross-sectional structure of a semiconductor device used commonly in recent years, in which a plurality of protection films such as those denoted by 42a to 42c exist, the electrode pad is of a double-layer structure including electrodes pads 24a and 24b, and interconnects 53 other than the lead interconnects 52 are formed in a plurality of layers. The semiconductor device of this structure can also be considered as included in Embodiment 1 and expected to obtain the effect described above as long as the lead interconnect 52 runs directly under the non-probe region 31 and do not run under the probe region 32. This also applies to other embodiments to follow.

Alteration to Embodiment 1

Figures 5A, 5B:
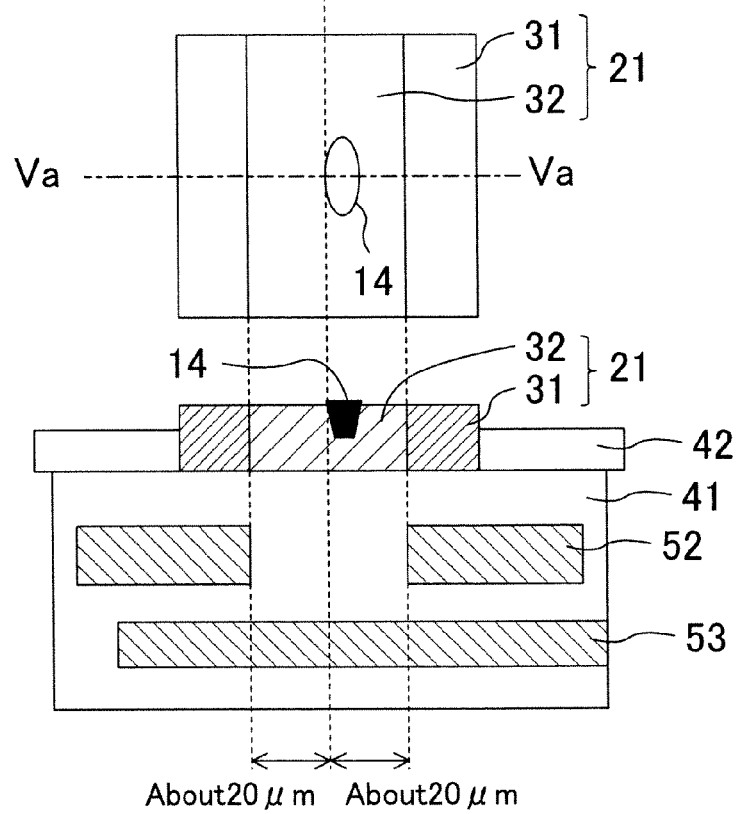
FIG. 5A is a plan/cross-sectional view of a semiconductor device of an alteration to Embodiment 1.
FIG. 5B shows experiment data verifying the usefulness of the alteration to Embodiment 1.

FIG. 5A is a plan/cross-sectional view of a semiconductor device of an alteration to Embodiment 1. The semiconductor device of this alteration is basically the same in configuration as Embodiment 1, but is characterized in that the probe region 32 is defined as a region within about 20 μm from the center line of the electrode pad 21, and the non-probe region 31 is defined as the region of the electrode pad 21 other than the probe region 32. Note that the center line of the electrode pad 21 as used herein refers to the center line of the electrode pad 21 extending roughly in parallel with running of the lead interconnect 52.

In the semiconductor device of this alteration, also, the lead interconnect 52 runs directly under the non-probe region 31 and do not run directly under the probe region 32.

The probe contact position can be recognized by observing the probe mark 14. FIG. 5B shows data from actual evaluation of the widths and end points of probe marks obtained in a probing test performed using a given probe card. From this data, it is found that the probe mark 14 will exist within the range of {average of probe mark width (a)+dispersion of probe mark width (b)+average of probe mark end position (c)+dispersion of probe mark end position (d)}/2=19.3 μm. From this, it is found that there is the possibility of having the probe mark 14 in the probe region 32 defined as a region within about 20 μm from the center line of the electrode pad 21. Since no lead interconnect exists directly under the probe region 32 in this alteration, the interlayer insulating film 41 can be thickened directly under the probe region 32, and thus occurrence of a crack is suppressed. Even if a crack occurs, there will be no occurrence of short-circuiting between the electrode pad 21 and the lead interconnect because no lead interconnect runs directly under the probe region 32.

Also, with no probe mark existing in the non-probe region 31 located more than about 20 μm away from the center line of the electrode pad 21, no crack will occur in the interlayer insulating film 41 between the electrode pad 21 and the lead interconnect 52.

Embodiment 2

Figure 6:
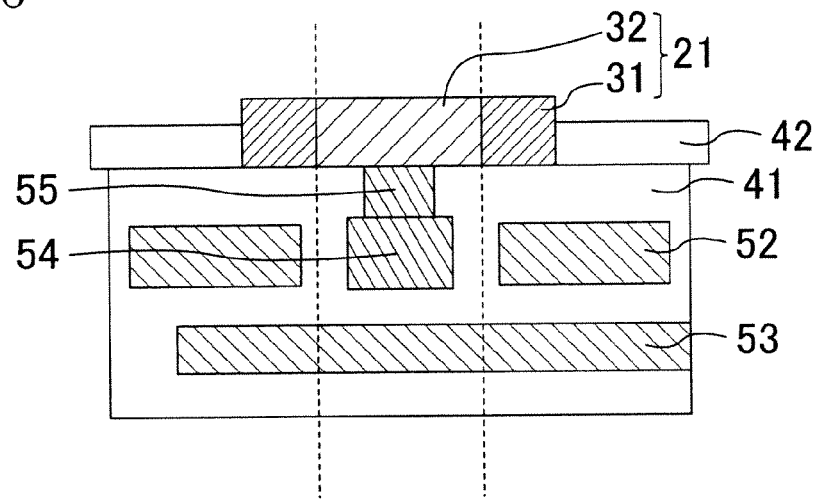
FIG. 6 is a cross-sectional view of a semiconductor device of Embodiment 2 of the present invention.

FIG. 6 is a cross-sectional view of a semiconductor device of Embodiment 2 of the present invention.

Referring to FIG. 6, the semiconductor device of this embodiment includes an internal circuit, lead interconnects 52, electrode pads 21 arranged zigzag in two or more rows around the internal circuit, and a protection film 42 surrounding the electrode pads 21. Each of the electrode pads 21 has the probe region 32 and the non-probe region 31 defined previously. The lead interconnects 52 run directly under the non-probe regions 31, but do not run directly under the probe regions 32. Each of the lead interconnects 52 is electrically independent of the electrode pad 21 located immediately above the lead interconnect.

A feature of the semiconductor device of this embodiment is having a pad metal 54 provided directly under the probe region 32 in the same wiring layer as the lead interconnects 52 and a connector 55 for connecting the pad metal 54 with the electrode pad 21.

In the semiconductor device of Embodiment 2 of the present invention, no lead interconnect exists directly under the probe region 32 and a multilayer pad structure including the electrode pad 21 and the pad metal 54 electrically connected with each other via the connector 55 is formed. Hence, even if a crack occurs in the interlayer insulating film 41 due to probe stress, no short-circuiting will occur between the electrode pad 21 and the lead interconnect 52 and between the electrode pad 21 and the interconnect 53. In the process of connecting the electrode pad with an external circuit, upward stress vertical to the chip plane is exerted. In the conventional semiconductor devices, therefore, coming off of the electrode pad may occur. In the semiconductor device of this embodiment, this trouble can be prevented. Also, the lead interconnect 52 runs directly under the non-probe region 31, so that the lead interconnect 52 and the electrode pad 21 can overlap each other as viewed from top. Dense arrangement of the electrode pads 21 can therefore be made without reducing the number of electrode pads allowed to be arranged per unit area. In the semiconductor device of this embodiment, one connector 55 is provided for each electrode pad 21 as shown in FIG. 6, and the space between the electrode pad 21 and the pad metal 54 is roughly entirely buried with metal. This configuration can minimize the electric resistance between the electric pad 21 and the pad metal 54. Also, as in the alteration to Embodiment 1, the probe region 32 may be defined as a region within about 20 μm from the center line of the electrode pad 21, and the non-probe region 31 may be defined as the region of the electrode pad 21 other than the probe region 32.

Alteration to Embodiment 2

Figure 7:
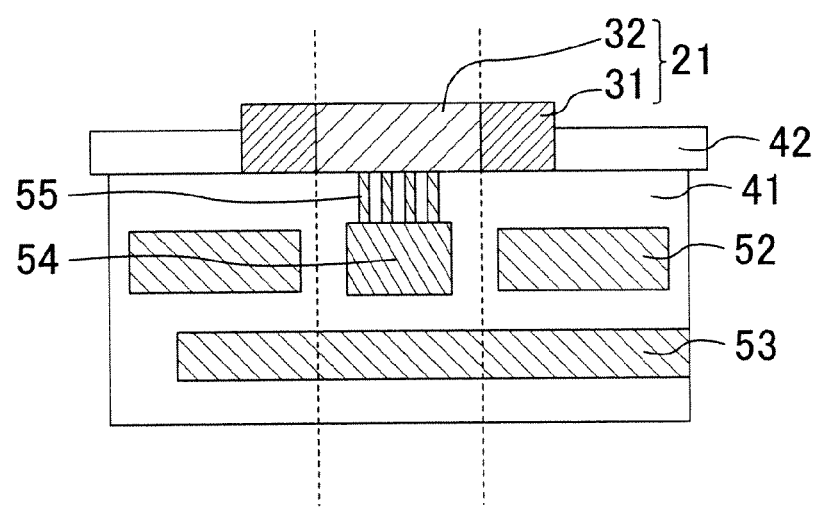
FIG. 7 is a cross-sectional view of a semiconductor device of an alteration to Embodiment 2 of the present invention.

FIG. 7 is a cross-sectional view of a semiconductor device of an alteration to Embodiment 2 of the present invention. Referring to FIG. 7, the connector 55 for connecting the electrode pad 21 with the pad metal 54 is in a via shape, in which a plurality of vias may be provided for one electrode pad 21. In general, the interlayer insulating film 41 is etched for formation of the connector 55. In this relation, the size of vias that can be formed in this etching is restricted depending on the process. In the semiconductor device of this alteration, the connector 55 is formed by a conventional connection via formation technique, to enable electrical connection between the electrode pad 21 and the pad metal 54. Formation of a plurality of vias can minimize the resistance. Such via-shaped metal bodies constituting the connector 55 are preferably arranged at equal intervals and uniformly as viewed from top. This configuration is useful because the probe stress exerted on the electrode pad 21 can be transferred to the pad metal uniformly, permitting dispersion of the stress.

Embodiment 3

FIGS. 8A to 8D are plan views of semiconductor devices of Embodiment 3 of the present invention. The configurations of the semiconductor devices of this embodiment are basically the same as those of Embodiments 1 and 2. Only the feature of this embodiment will then be described.

Figure 8A:
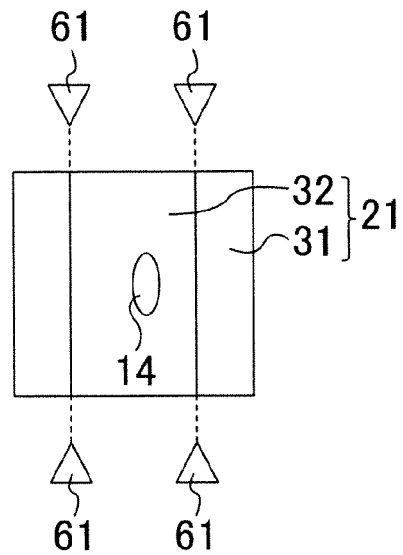
FIGS. 8A to 8D are plan views of semiconductor devices of Embodiment 3 of the present invention.
Figure 8B:
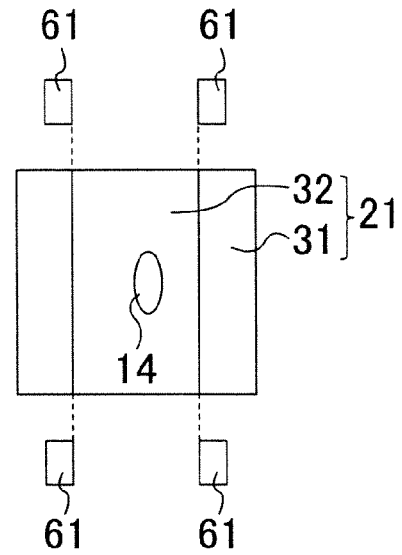

In the semiconductor device of this embodiment shown in FIG. 8A, optically distinguishable marks 61 are placed at positions on extensions from the boundaries between the probe region 32 and the non-probe region 31. With the placement of such marks 61, it is possible to discriminate the probe permit region from the probe prohibit region, or the probe region 32 from the non-probe region 31, visually or by means of an alignment device capable of making distinctions among optical shades. The probe mark 14 is also optically distinguishable. Hence, with an alignment device capable of recognizing the marks 61 and the probe mark 14 from the optical shades, monitoring can be made to ensure that the probe mark 14 does not exist in the non-probe region 31 in each probing process. This dramatically facilitates the process management. Note that the marks 61 may be of any shape as long as the boundaries can be distinguished. For example, as shown in FIG. 8B, they may be rectangular. In the example of FIG. 8B, the inner side of each rectangular mark 61 may be recognized, to discriminate the probe region 32 from the non-probe region 31.

Figure 8C:
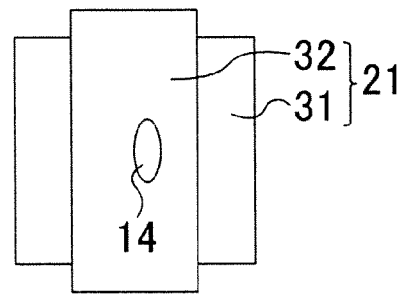

As shown in FIG. 8C, marks may be formed by means of a top metal layer of the electrode pad 21, to discriminate the prove region 32 from the non-prove region 31. In this case, formation of marks can be made without changing the conventional process steps. In the example of FIG. 8C, steps are provided in the top metal between the probe region 32 and the non-probe region 31 as viewed from top, to thereby permit optical determination of the boundaries.

Figure 8D:
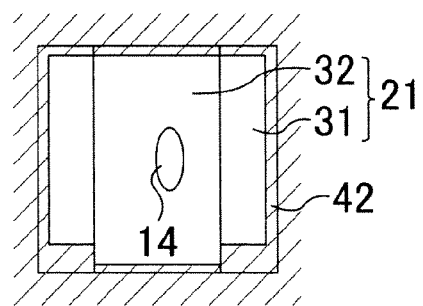
Figure 9A:
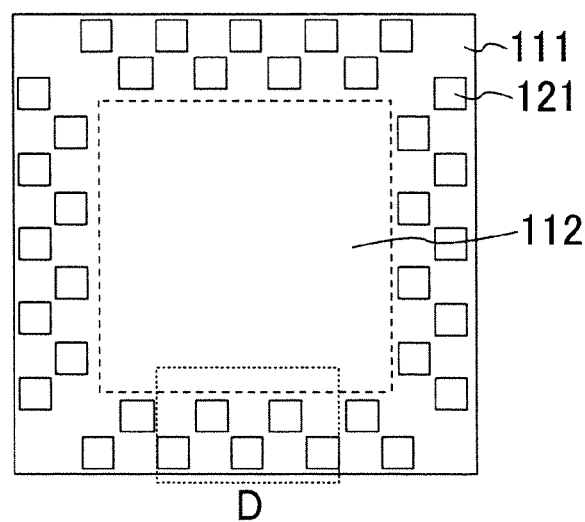
FIG. 9A is a plan view showing the structure of electrode pads of the first conventional semiconductor device.
Figure 9B:
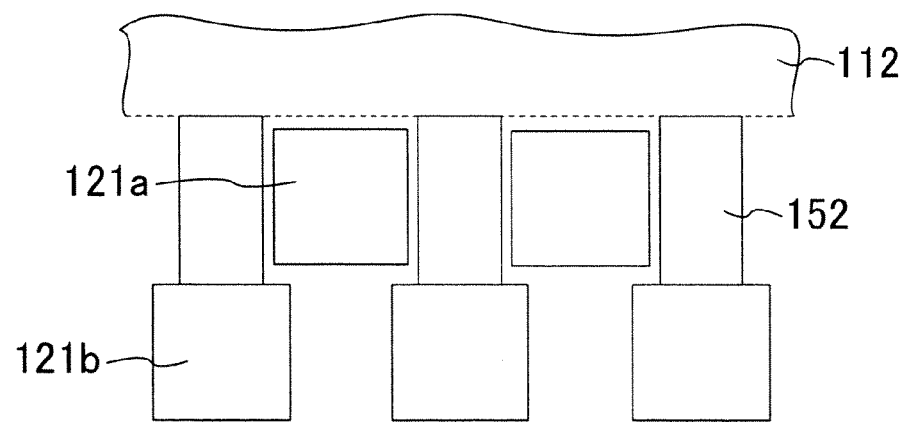
FIG. 9B is an enlarged plan view of region D in FIG. 9A.
Figure 10A:
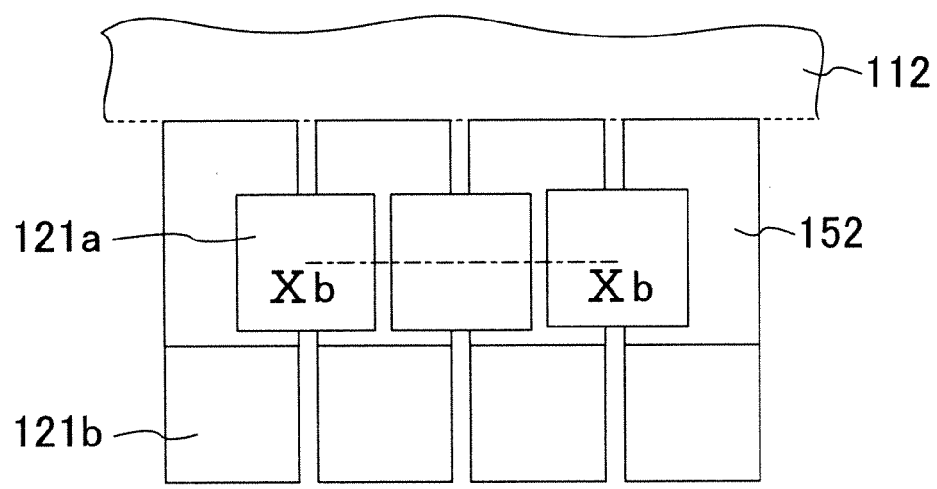
FIG. 10A is an enlarged plan view showing the structure of electrode pads of the second conventional semiconductor device.
Figure 10B:
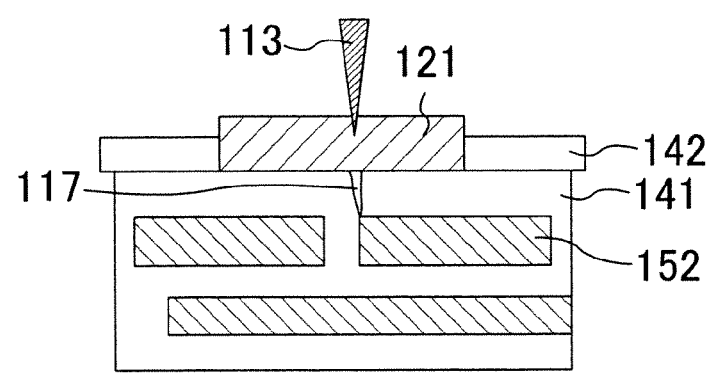
FIG. 10B is a cross-sectional view schematically illustrating occurrence of a crack in the second conventional semiconductor device.

Otherwise, as shown in FIG. 8D, marks may be formed by means of the protection film 42 on the electrode pad 21, to discriminate the probe region 32 from the non-probe region 31. In this case, also, formation of marks can be made without changing the conventional process steps in the process of forming the protection film 42 on the electrode pads 21. In the example of FIG. 8D, steps are provided in the shape of the opening of the protection film 42, to thereby permit optical determination of the boundaries between the probe region 32 and the non-probe region 31. For example, the position of the top surface of the protection film 42 may be made higher in the portion above the non-prove region 31 than in the portion above the prove region 32, to thereby permit optical determination of the boundaries between the probe region 32 and the non-probe region 31. The protection film 42 can be of any shape as long as it can indicate the boundaries between the probe region 32 and the non-probe region 31.

As described above, the present invention is useful for a semiconductor device that is small in chip size and requires a number of terminals.

While the present invention has been described in preferred embodiments, it will be apparent to those skilled in the art that the disclosed invention may be modified in numerous ways and may assume many embodiments other than those specifically set out and described above. Accordingly, it is intended by the appended claims to cover all modifications of the invention which fall within the true spirit and scope of the invention.

What is claimed is:

1. A semiconductor device comprising:
   an electrode pad having a probe region and a non-probe region,
   a pad metal disposed under the probe region, the pad metal electrically connected to the electrode pad, and
   a metal layer disposed under the non-probe region,
   wherein the pad metal and the metal layer are disposed in a same layer, and
   a plurality of the electrode pads are arranged in a zigzag pattern.

2. The device of claim 1, wherein the electrode pad and the pad metal are connected by a connector.

3. The device of claim 2, wherein the connector is made of metal.

4. The device of claim 3, wherein the connector is smaller than the pad metal.

5. The device of claim 4, wherein an interlayer insulating film is disposed between the electrode pad and the metal layer.

6. The device of claim 5, wherein the plurality of electrode pads surround an internal circuit in plan view.

7. The device of claim 6, further comprising a bump disposed on the electrode pad.

8. The device of claim 7, wherein the metal layer is not electrically connected to the electrode pad.

9. The device of claim 8, wherein the probe region is placed in a region within 20 µm from a center line of the electrode pad extending substantially in parallel with a longitudinal axis of the metal layer, and the non-probe region is placed in a region of the electrode pad other than the probe region.

10. The device of claim 1, wherein there is no other metal layer disposed between said metal layer and said electrode pad.

11. A semiconductor device comprising:
    an electrode pad,
    a probe mark left on the electrode pad,
    a pad metal disposed under the probe mark, the pad metal electrically connected to the electrode pad, and
    a metal layer disposed under the electrode pad in an area outside of the probe mark in plan view,
    wherein the pad metal and the metal layer are disposed in a same layer, and
    a plurality of the electrode pads are arranged in a zigzag pattern.

12. The device of claim 11, wherein the electrode pad and the pad metal are connected by a connector.

13. The device of claim 12, wherein the connector is made of metal.

14. The device of claim 13, wherein the connector is smaller than the pad metal.

15. The device of claim 14, wherein an interlayer insulating film is disposed between the electrode pad and the metal layer.

16. The device of claim 15, wherein the plurality of electrode pads surround an internal circuit in plan view.

17. The device of claim 16, further comprising a bump disposed on the electrode pad.

18. The device of claim 17, wherein the metal layer is not electrically connected to the electrode pad.

19. The device of claim 11, wherein there is no other metal layer disposed between said metal layer and said electrode pad.

* * * * *